(12) United States Patent
Yoda

(10) Patent No.: US 6,411,247 B2
(45) Date of Patent: Jun. 25, 2002

(54) ANALOG/DIGITAL CONVERTER

(75) Inventor: Kiwamu Yoda, Osaka (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/814,028

(22) Filed: Mar. 22, 2001

(30) Foreign Application Priority Data

Jun. 9, 2000 (JP) ........................................ 2000-174160

(51) Int. Cl.[7] .................................................. H03M 1/82
(52) U.S. Cl. ...................................... 341/167; 341/155
(58) Field of Search ................................ 341/155, 167, 341/168

(56) References Cited

U.S. PATENT DOCUMENTS 4,884,075 A * 11/1989 Mangelsdorf ............... 341/159
6,188,346 B1 * 2/2001 Waho et al. ................. 341/156

* cited by examiner

*Primary Examiner*—Peguy Jeanpierre
(74) *Attorney, Agent, or Firm*—Rabin & Berdo, P.C.

(57) ABSTRACT

An integration voltage obtained by continuously integrating an input voltage and a reference voltage is compared with a base voltage GND by a voltage comparator. The time that is required until a comparison result is inverted is counted by a counter And a count result is outputted as a digital signal OUT. In voltage comparators, the integration voltage is compared with a voltage that is higher than the base voltage GND by a predetermined voltage and with a voltage that is lower than the base voltage GND by a predetermined voltage, respectively. A difference between the inversion time of the comparison result of the voltage comparator and that of the voltage comparator is measured by a subtractor.

6 Claims, 3 Drawing Sheets ably. An operational amplifier 2 constructing a voltage
ANALOG/DIGITAL CONVERTER

BACKGROUND OF THE INVENTION

1. Field of the Invention

The invention relates to an analog/digital converter (hereinafter, referred to as "ADC") for converting an analog voltage into a digital signal and, more particularly, to a technique for preventing errors which are caused due to external noises of a dual-slope conversion type ADC.

2. Related Background Art

FIG. 2 is a constructional diagram of a conventional dual-slope conversion type ADC.

The dual-slope conversion type ADC has an analog switch 1 for switching an input voltage Vi as a conversion target and a reference voltage −Vr and inputting the switched voltage. An operational amplifier 2 constructing a voltage follower is connected to an output side of the analog switch 1. An output side of the operational amplifier 2 is connected to an inversion input terminal of an operational amplifier 4 through a resistor 3. A capacitor 5 and an analog switch 6 are connected in parallel between the inversion input terminal of the operational amplifier 4 and its output terminal. A non-inversion input terminal of the operational amplifier 4 is connected to a base voltage GND. The output side of the operational amplifier 4 is connected to a first input terminal of a voltage comparator 7. A second input terminal of the voltage comparator 7 is connected to the base voltage GND and its output side is connected to a control circuit 8.

The control circuit 8 generates control signals C1 and C6 to the analog switches 1 and 6 and generates a control signal C9 to a counter 9 on the basis of an output signal S7 of the voltage comparator 7. The counter 9 counts the number of clock signals (not shown) in response to the control signal C9. A count value of the counter 9 is outputted as a digital signal OUT corresponding to the input voltage Vi.

FIG. 3 is a signal waveform diagram showing the operation of the circuit shown in FIG. 2. In FIG. 3, a solid line indicates an integration voltage V4 on the output side of the operational amplifier 4 in the case where the input voltage Vi is large, and a broken line shows the integration voltage V4 in the case where the input voltage Vi is small.

First, for a reset period from time 0 to time T0, the analog switch 6 is short-circuited by the control signal C6 which is generated from the control circuit 8 and the capacitor 5 is discharged. Since the non-inversion input terminal of the operational amplifier 4 is connected to the base voltage GND, an electric potential at the inversion input terminal is also set to the base voltage GND and the integration voltage V4 is set to the base voltage GND (that is, 0V).

Subsequently, at time T0, the analog switch 6 is opened by the control signal C6. and the input voltage Vi side of the analog switch 1 is selected :by the control signal C1. Thus, a current which is supplied from the output side of the operational amplifier 2 to the resistor 3 is set to Vi/R (where, R is a resistance value of the resistor 3).

In the ideal operational amplifier 4, since the electric potential at the inversion input terminal is equal to the base voltage GND and an input impedance is infinite, the whole current flowing in the resistor 3 is charged into the capacitor 5. Thus, the integration voltage V4 after the elapse of a predetermined time t1 of the first integration period is equal to −(1/CR)Vi·t1 (where, C is a capacitance of the capacitor 5).

A second integration period is started at time T1 after the elapse of time t1 from time T0. The control signal C9 to start the counting operation is generated from the control circuit 8 to the counter 9 and the analog switch 1 is switched to the reference voltage −Vr side by the control signal C1. Therefore, a current of −Vr/R is supplied from the output side of the operational amplifier 2 to the resistor 3.

The integration voltage V4 after the elapse of time t2 from time T1 is expressed by the following equation (1).

$$V4 = -(1/CR)Vi \cdot t1 + (1/CR)Vr \cdot t2 \tag{1}$$

When the integration voltage V4 is equal to the base voltage GND, the signal S7 is generated from the voltage comparator 7 to the control circuit 8. The control circuit 8 stops the control signal C9, thereby stopping the counting operation of the counter 9. From the equation (1), time t2 is expressed by the following equation (2).

$$t2 = (Vi/Vr)t1 \tag{2}$$

Since Vr and t1 are set to predetermined values, time t2 is proportional to the input voltage Vi and the digital signal OUT which is outputted from the counter 9 is equal to a value that is proportional to the input voltage Vi.

However, the conventional dual-slope conversion type ADC has the following problem.

When noises are inputted from the outside during the converting operation, the voltage that is charged into the capacitor 5 is influenced. Since the first integration period has been preset to the predetermined time, if the period is set to a value that is integer times as long as a presumed period of power noises or the like, a positive component and a negative component of the noises can be set off. Since the second integration period, however, changes in proportion to the input voltage Vi, the external noises cannot be set off. There is, consequently, a problem that a conversion error is caused by the external noises.

SUMMARY OF THE INVENTION

It is, therefore, an object of the invention to solve the problem of the conventional technique and provide a dual-slope conversion type ADC which is hardly influenced by external noises.

According to the first aspect of the invention, the above object is accomplished by an analog/digital converter (ADC) comprising: switching means for switching an analog voltage as a conversion target and a reference voltage whose polarity is different from that of the analog voltage and sequentially outputting them; integrating means for continuously integrating the analog voltage and the reference voltage which are outputted from the switching means and forming an integration voltage; first comparing means for comparing the integration voltage with a base voltage and outputting a first comparison result; second comparing means for comparing the integration voltage with a voltage that is higher than the base voltage by a predetermined voltage and outputting a second comparison result; third comparing means for comparing the integration voltage with a voltage that is lower than the base voltage by a predetermined voltage and outputting a third comparison result; counting means for counting a time which is required from a start of the integration of the reference voltage in the integrating means to a timing when the first comparison result is inverted and outputting a count result as a digital signal corresponding to the analog voltage; first measuring means for measuring a difference between the inversion time of the first comparison result and that of the second comparison result; second measuring means for measuring a difference between the inversion time of the first comparison result and that of the third comparison result; and comparing means for comparing measurement results of the first and second measuring means and discriminating whether a difference between them lies within the permission value or not.

According to the first aspect of the invention, since the ADC is constructed as mentioned above, the following operation is executed.

First, the analog voltage as a conversion target is outputted from the switching means and integrated by the integrating means. Subsequently, the reference voltage is outputted from the switching means and continuously integrated by the integrating means. The integration voltage formed by the integrating means is compared with the base voltage by the first comparing means and the first comparison result is outputted. The time which is required from the start of the integration of the reference voltage by the integrating means to the inversion of the first comparison result is counted by the counting means. The count result is outputted as a digital signal.

The integration voltage is compared with the voltage that is higher than the base voltage by the predetermined voltage by the second comparing means and the second comparison result is outputted. The integration voltage is compared with the voltage that is lower than the base voltage by the predetermined voltage by the third comparing means and the third comparison result is outputted. The difference between the inversion time of the first comparison result and that of the second comparison result is measured by the first measuring means. The difference between the inversion time of the first comparison result and that of the third comparison result is measured by the second measuring means. The measurement results of the first and second measuring means are compared by the comparing means and whether a difference between them lies within the permission value or not is discriminated.

According to the second aspect of the invention, there is provided an ADC comprising: the switching means, integrating means, first, second, and third comparing means, and counting means which are similar to those in the first aspect of the invention; and external control means for generating a control signal for stopping the operation to an external circuit serving as a noise generation source for a period of time from a timing when the second or third comparison result has been inverted to a timing when the first comparison result is inverted.

According to the second aspect of the invention, the following operation is executed. First, an analog voltage as a conversion target is outputted from the switching means and integrated by the integrating means. Subsequently, the reference voltage is outputted from the switching means and continuously integrated by the integrating means. The integration voltage formed by the integrating means is compared with the base voltage by the first comparing means and a first comparison result is outputted. The time which is required from the start of the integration of the reference voltage by the integrating means to a timing when the first comparison result is inverted is counted by the counting means. A count result is outputted as a digital signal.

The integration voltage is compared with the voltage that is higher than the base voltage by a predetermined voltage by the second comparing means and the second comparison result is outputted. The integration voltage is compared with the voltage that is lower than the base voltage by a predetermined voltage by the third comparing means and the third comparison result is outputted. The second and third comparison results are supplied to the external control means. For a period of time from a timing when the second or third comparison result has been inverted to a timing when the first comparison result is inverted, the control signal to stop the operation of the external circuit serving as a noise generation source is generated.

The above and other objects and features of the present invention will become apparent from the following detailed description and the appended claims with reference to the accompanying drawings.

DETAILED DESCRIPTION OF THE PREFERRED EMBODIMENT

Figure 1:
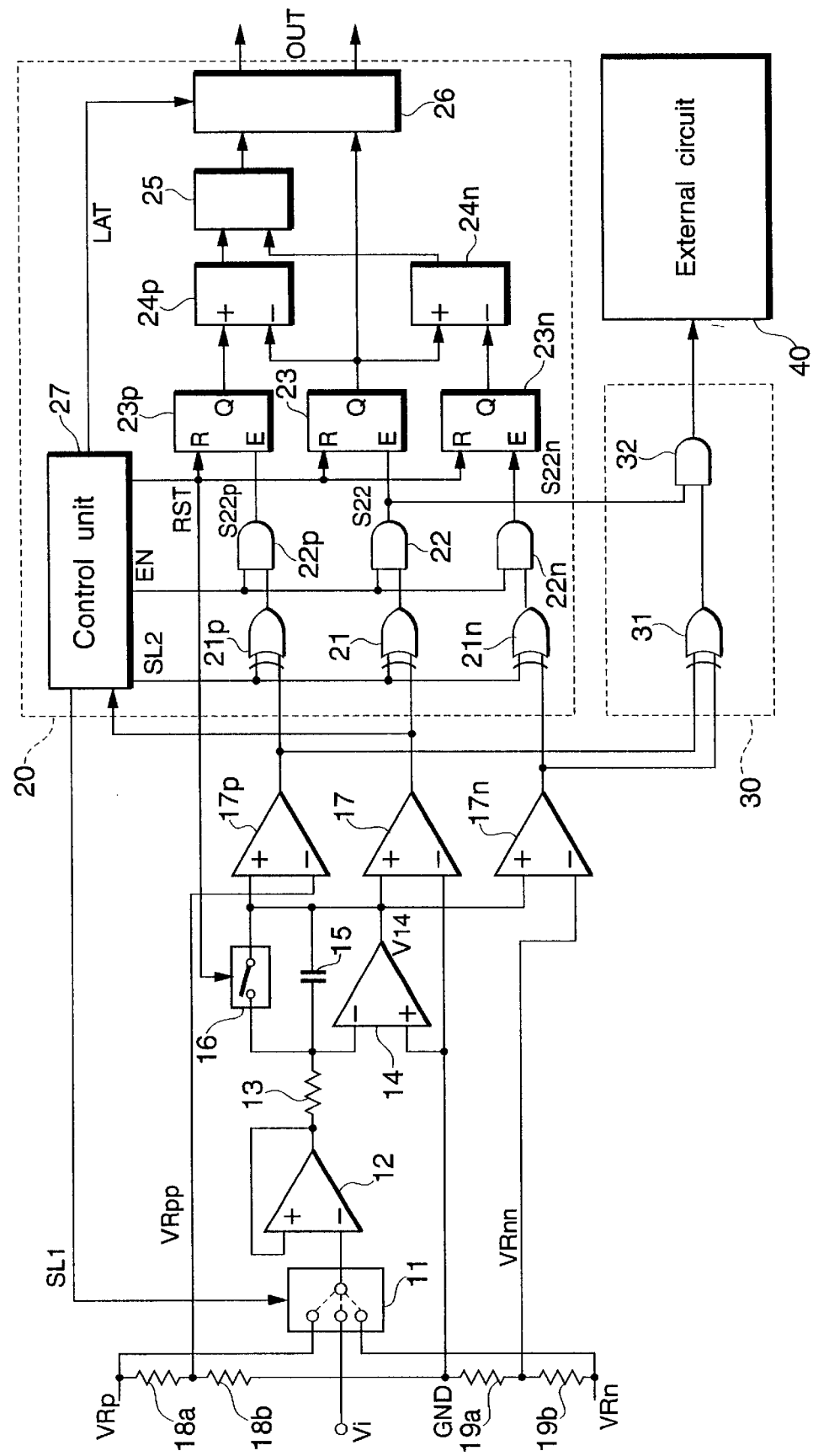
FIG. 1 is a constructional diagram of a dual-slope conversion type ADC showing an embodiment of the invention.
Figure 2:
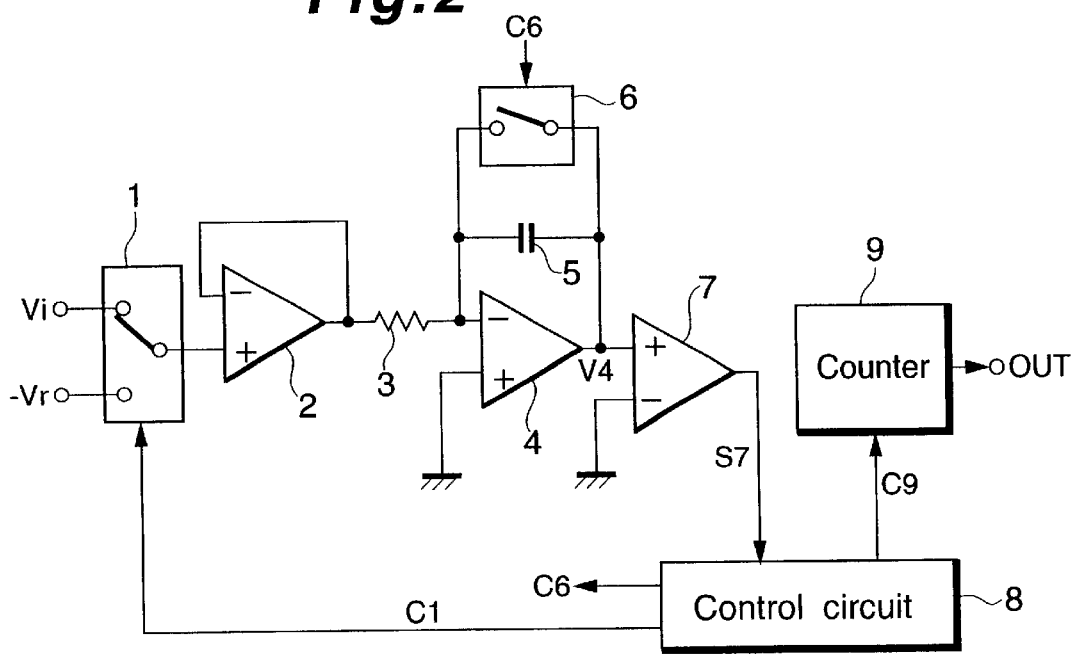
FIG. 2 is a constructional diagram of a conventional dual-slope conversion type ADC.
Figure 3:
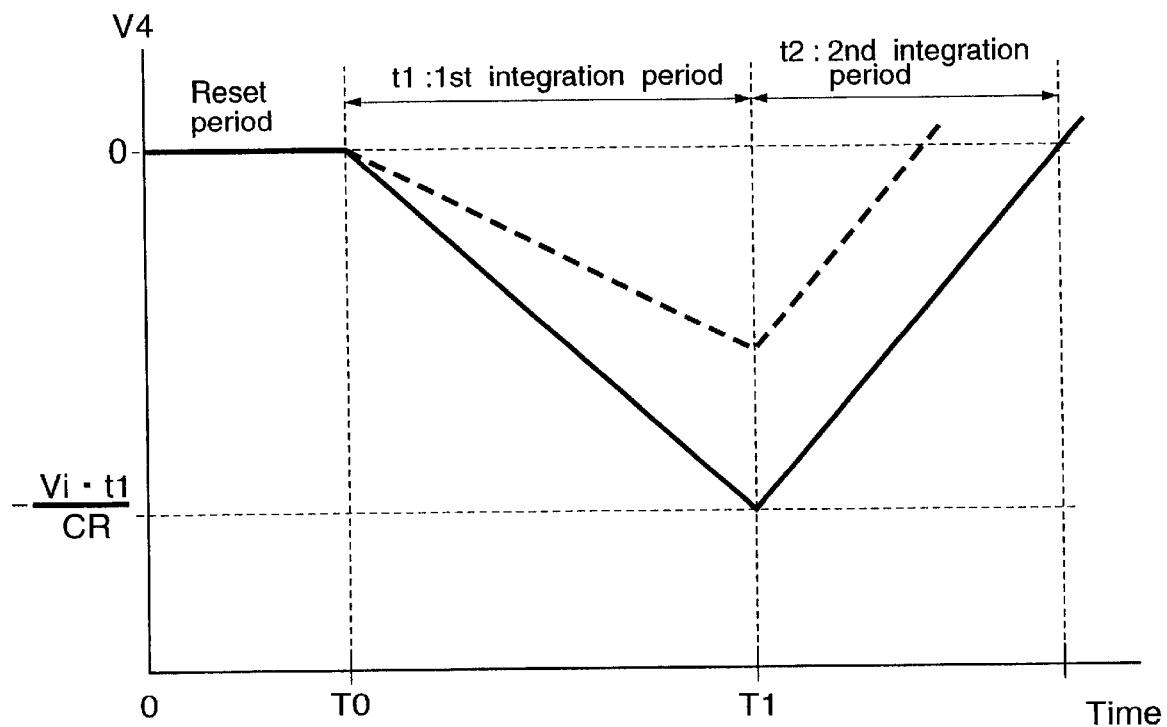
FIG. 3 is a signal waveform diagram showing the operation of the circuit shown in FIG. 2.

FIG. 1 is a constructional diagram of a dual-slope conversion type ADC showing an embodiment of the invention.

The dual-slope conversion type ADC has switching means (for example, analog switch) 11 for switching the analog input voltage Vi as a conversion target and a positive reference voltage VRp (for example, +10V) or a negative reference voltage VRn (for example, −10V) and inputting. An operational amplifier 12 constructing a voltage follower is connected to an output side of the analog switch 11. An output side of the operational amplifier 12 is connected to an inversion input terminal of an operational amplifier 14 through a resistor 13 of integrating means (for example, the resistor 13, the operational amplifier 14, and a capacitor 15). The capacitor 15 and an analog switch 16 are connected in parallel between the inversion input terminal and an output terminal of the operational amplifier 14. A non-inversion input terminal of the operational amplifier 14 is connected to the base voltage GND (for example, 0V). The output side of the operational amplifier 14 is connected in common to first input terminals of comparing means (for example, voltage comparators) 17, 17p, and 17n.

A second input terminal of the voltage comparator 17 is connected to the base voltage GND. A base Voltage VRpp (for example, +1V) formed by voltage-dividing the reference voltage VRp by resistors 18a and 18b is supplied to a second input terminal of the voltage comparator 17p. A base voltage VRnn (for example, −1V) formed by voltage-dividing the reference voltage VRn by resistors 19a and 19b is supplied to a second input terminal of the voltage comparator 17n. The base voltages VRpp and VRnn are set to voltages whose polarities are opposite to that of the base voltage GND and whose absolute values are equal.

A control processing circuit 20 and external control means (for example, external control circuit) 30 are connected to output sides of the voltage comparators 17, 17p, and 17n.

The control processing circuit 20 has exclusive OR gates (hereinafter, abbreviated to "EOR") 21, 21p, and 21n. The output sides of the voltage comparators 17, 17p, and 17n are connected to first input terminals of those gates, respectively. A selection signal SL2, which will be explained hereinlater, is supplied in common to second input terminals of the EORs 21, 21p, and 21n. Output sides of the EORs 21, 21p, and 21n are connected to first input terminals of 2-input AND gates (hereinafter, abbreviated to "AND") 22, 22p, and 22n, respectively. An enable signal EN is supplied to second input terminals of the ANDs 22, 22p, and 22n, respectively.

Output sides of the AND gates 22, 22p, and 22n are connected to enable terminals E of counting means (for example, counters) 23, 23p, and 23n, respectively. A reset signal RST to reset count values of the counters 23, 23p, and 23n to 0 is supplied in common to reset terminals R of those counters. The counters 23, 23p, and 23n count the number of common clock signals (not shown) in response to signals S22, S22p, and S22n which are supplied from the ANDs 22, 22p, and 22n to the enable terminals E and output count values from output terminals Q, respectively.

Output sides of the counters 23 and 23p are connected to an input side of first measuring means (for example, subtractor) 24p. Output sides of the counters 23 and 23n are connected to an input side of second measuring means (for example, subtractor) 24n. Each of the subtractors 24p and 24n calculates a difference between two values inputted to the input sides. Output sides of the subtractors 24p and 24n are connected to an input side of comparing means (for example, comparator) 25. The comparator 25 discriminates whether a difference between two values inputted to the input side lies within the permission value or not. A comparison discrimination result of the comparator 25 and the count value of the counter 23 are supplied to a data latch 26. The data latch 26 holds the supplied data in response to a latch signal LAT and outputs it.

The control processing circuit 20 has a control unit 27 for controlling a processing timing on the basis of a common clock signal. The control unit 27 closes the analog switch 16 prior to a converting process, discharges the capacitor 15, and generates the reset signal RST for resetting the count values of the counters 23, 23p, and 23n to an initial value (that is, 0). The control unit 27 also switches the analog switch 11 by a selection signal SL1 to the input signal Vi side, thereby starting a first integration period.

The control unit 27 has functions for selecting a reference voltage which is used for a second integration period on the basis of the polarity of the voltage charged in the capacitor 15 for the first integration period and generating the selection signal SL2 for performing an inversion control of output signals of the comparators 17, 17p, and 17n, respectively. The control unit 27 further has functions for generating the enable signal EN for making the counters 23, 23p, and 23n operative and the latch signal LAT for holding the data indicative of the conversion results and outputting it as a digital signal OUT.

In order to avoid an erroneous operation upon counting due to external noises, the external control circuit 30 generates a stop signal STP for stopping the operation of an external circuit only for the minimum time zone in a state where the counting operation is easily influenced. The external control circuit 30 is constructed by an EOR 31 and a 2-input AND 32. An input side of the EOR 31 is connected to the output sides of the comparators 17p and 17n. Output sides of the EOR 31 and AND 22 are connected to an input side of the AND 32. The stop signal STP is outputted from an output side of the AND 32 and supplied to an external circuit 40.

Figure 4:
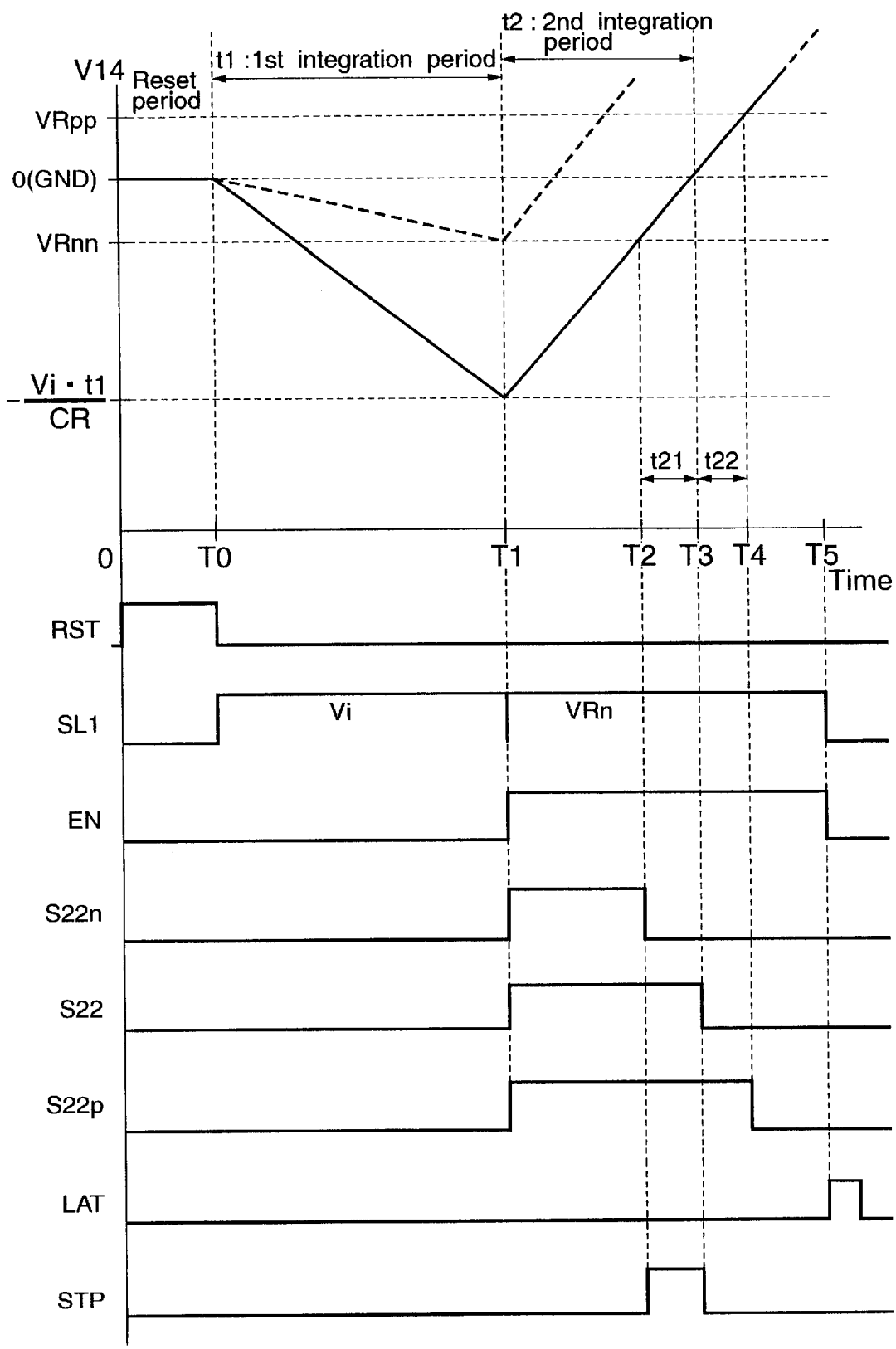
FIG. 4 is a signal waveform diagram showing the operation in each section in FIG. 1.

FIG. 4 is a signal waveform diagram showing the operation of each section in FIG. 1. The operation of the circuit shown in FIG. 1 will be described hereinbelow with reference to FIG. 4 by separating into (I) the operation of the control processing circuit 20 and (II) the operation of the external control circuit 30. An explanation will be made on the assumption that the input voltage Vi is the positive voltage.

(I) Operation of the Control Processing Circuit 20

For a reset period from time 0 to time T0, the reset signal RST is generated from the control unit 27, the counters 23, 23p, and 23n are reset, the analog switch 16 is short-circuited, and the capacitor 15 is discharged. Since the non-inversion input terminal of the operational amplifier 14 is connected to the base voltage GND, an electric potential at the inversion input terminal is also set to the base voltage GND. An integration voltage V14 on the output side of the operational amplifier 14 is equal to the base voltage GND (namely, 0V).

At time T0, the reset signal RST is cancelled, the analog switch 16 is turned off, and the input voltage Vi side of the analog switch 11 is selected by the selection signal SL1. Thus, the current is supplied to the resistor 13 from the output side of the operational amplifier 12. Now, assuming that the operational amplifier 14 is an ideal amplifier, the electric potential at the inversion input terminal is equal to the base voltage GND. Since an input impedance is infinite, assuming that the resistor 13 has a resistance value R, the current flowing in the resistor 13 is set to a predetermined value Vi/R. The current flowing in the resistor 13 is charged into the capacitor 15. Assuming that the capacitor 15 has a capacitance C, the integration voltage V14 after the elapse of the predetermined time t1 in the first integration period is equal to $-V_i \cdot t1/CR$.

Since the integration voltage V14 has a negative value at time T1 after the expiration of time t1 from time T0, the output signals of the voltage comparators 17, 17p, and 17n are set to the level "L". The output signal of the voltage comparator 17 is supplied to the control unit 27. In the control unit 27, the input voltage Vi is determined to be positive. Thus, the selection signal SL1 for switching the analog switch 11 to the negative reference voltage VRn and the selection signal SL2 at the "L" level for inverting the output signals of the voltage comparators 17, 17p, and 17n are generated from the control unit 27. At the same time, the enable signal EN for starting the counting operation of each of the counters 23, 23p, and 23n is generated from the control unit 27. The signals S22, S22p, and S22n which are outputted from the ANDs 22, 22p, and 22n are set to the level "H". Each of the counters 23, 23p, and 23n starts the operation to count the number of common clock signals.

When the second integration period is started as mentioned above, the output voltage of the operational amplifier 12 is set to the negative reference voltage VRn and a current VRn/R flows in the resistor 13. Therefore, the integration voltage V14 after the expiration of time t from time T1 is expressed by the following equation (3).

$$V14 = -(1/CR)V_i \cdot t1 + (1/CR)VRn \cdot t \tag{3}$$

As shown in the equation (3), the integration voltage V14 continuously rises at a predetermined rising rate.

When the integration voltage V14 reaches the base voltage VRnn at time T2, the output signal of the voltage comparator 17n is inverted, the output signal S22n of the AND 22n is set to "L", and the operation of the counter 23n is stopped.

When the integration voltage V14 reaches the base voltage GND at time T3, the output signal of the voltage comparator 17 is inverted, the output signal S22 of the AND 22 is set to "L", and the operation of the counter 23 is stopped. Assuming that the elapsed time between time T1 and time T3 is equal to t2, time t2 is obtained by the following equation (4).

$$t2 = (Vi/VRn)t1 \tag{4}$$

Since VRn and t1 are set to the predetermined values, time t2 is proportional to the input voltage Vi and the count value of the counter 23 is equal to the value corresponding to the input voltage Vi.

When the integration voltage V14 reaches the base voltage VRpp at time T4, the output signal of the voltage comparator 17p is inverted, the output signal S22p of the AND 22p is set to "L", and the operation of the counter 23p is stopped.

The count values of the counters 23n and 23 are supplied to the subtractor 24n and a difference between them, that is, a value corresponding to time t21 between time T2 and time T3 is calculated. The count values of the counters 23 and 23p are supplied to the subtractor 24p and a difference between them, that is, a value corresponding to time t22 between time T3 and time T4 is calculated. Further, the values calculated by the subtractors 24n and 24p are supplied to the comparator 25 and whether a difference between them lies within the permission value or not is discriminated. A comparison discrimination result is supplied to the data latch 26.

When the latch signal LAT is generated from the control unit 27 at time T5, the comparison discrimination result of the comparator 25 and the count value of the counter 23 are held by the data latch 26 and outputted as a digital signal OUT.

If there is no influence by the external noises here, the rising rate of the integration voltage V14 in the second integration period is constant. An increase amount (that is, base voltage VRnn) of the integration voltage V14 for a period of time between time T2 and time T3 and an increase amount (that is, base voltage VRpp) of the integration voltage V14 for a period of time between time T3 and time T4 are set to an equal value. Therefore, it will be understood that if it is determined that time t21 and time t22 are different on the basis of the comparison discrimination result of the comparator 25, an influence by the external noises is caused for this period of time and that the count value of the counter 23 is influenced by the external noises. If it is determined that the difference between time t21 and time t22 lies within the permission value, it is possible to consider that the count value of the counter 23 is not influenced by the external noises.

Like an integration voltage V14 shown by a broken line in FIG. 4, if the absolute value of the input voltage Vi is small and the voltage at time T1 is higher than the base voltage VRnn, valid time t21 cannot be counted and it is determined in the comparator 25 that the difference is out of the permission value. In this case, since the count value of the counter 23 is small in correspondence to the input voltage Vi, it is sufficient that it is regarded as a conversion result as it is without referring to the comparison discrimination result of the comparator 25.

(II) Operation of the External Control Circuit 30

When the integration voltage V14 reaches the base voltage VRnn at time T2 in FIG. 4, the output signal of the voltage comparator 17n is inverted and the output signal of the EOR 31 in the external control circuit 30 is set to "H". At this time, since the output signal S22 of the AND 22 is at the "H" level, the output signal of the AND 32 is set to "H" and it is supplied as a stop signal STP to the external circuit 40. Thus, the operation of the external circuit 40 is temporarily stopped and the influence by the external noises is perfectly eliminated.

When the second integration period is terminated and the output signal S22 of the AND 22 is at the "L" level at time T3, the output signal of the AND 32 is set to "L" and the stop signal STP is cancelled. Thus, the operation of the external circuit 40 is restarted.

Although the operation has been described above on the assumption that the input voltage Vi is the positive voltage, almost the similar operation is executed even at a negative voltage. However, in the first integration period, the integration voltage V14 is charged to the positive voltage. Thus, in the second integration period, the positive reference voltage VRp is selected by the selection signal SL1, the selection signal SL2 is set to "H", and the output signals of the voltage comparators 17, 17p, and 17n are not inverted but supplied as they are to the ANDs 22, 22p, and 22n. The other operation is similar to that in the case where the input voltage Vi is a positive voltage.

As mentioned above, the dual-slope conversion type ADC of the embodiment has the following advantages (1) and (2).

(1) In order to discriminate the rising rate of the integration voltage V14 is constant or not during the second integration period, in addition to the voltage comparator 17 and counter 23 which are inherently provided for the ADC, the voltage comparators 17p and 17n, counters 23p and 23n, subtractors 24p and 24n, and comparator 25 are provided. If noises are mixed into the circuit during the conversion, a resistance of the circuit portion in the analog/digital converter is changed by the noises. The inverting time of the output signal is also changed by such a resistance change, so that the slope of the integration voltage changes and (t0≠0) is caused. Thus, the influence by the external noises can be discriminated on the basis of a check result about whether the rising rate of the integration voltage V14 is constant or not.

(2) There is provided the external control circuit 30 for stopping the operation of the external circuit 40 only for the period of time corresponding to the predetermined voltage just before the integration voltage V14 reaches the base voltage GND for the second integration period. Thus, the operation of the external circuit 40 can be stopped only for the minimum time zone in a state where the counting operation is easily influenced. The influence on the external circuit 40 is small and the erroneous operation can be prevented.

The invention is not limited, to the foregoing embodiment but many modifications are possible. For example, there are the following modifications (a) to (e).

(a) Although the input voltages Vi of the positive and negative polarities can be converted, the invention can be also applied to a construction such that the input voltage of only one of the polarities is converted.

(b) The construction of the control processing circuit 20 is not limited to the construction shown in FIG. 1. For instance, if the counter 23n counts time t21 between time T2 and time T3 in FIG. 4 and the counter 23p counts time t22 between time T3 and time T4, the subtractors 24n and 24p are unnecessary.

(c) If the external noises can be perfectly stopped by the external control circuit 30, the component elements (for example, the counters 23p and 23n, comparator 25, and the like) for discriminating the influence by the external noises in the control processing circuit 20 can be omitted.

(d) If the external circuit which generates noises such as to exert an influence on the converting operation does not exist or the external circuit 40 cannot be stopped, the external control circuit 30 is unnecessary.

(e) Although the control processing circuit 20 and external control circuit 30 are constructed by hardware such as logic gates or the like, it is also possible to control by software by using a microprocessor or the like.

As described in detail above, the ADC according to the first aspect of the invention comprises: the second and third comparing means for comparing the integration voltage with the voltage which is higher than the base voltage by the predetermined voltage and with the voltage which is lower than the base voltage by the predetermined voltage; and the first and second measuring means and comparing means for discriminating whether the change ratio of the integration voltage is constant or not on the basis of the comparison results of the second and third comparing means. Thus, whether the conversion result has been influenced by the external noises or not can be discriminated.

The ADC according to the second aspect of the invention comprises: the second and third comparing means for comparing the integration voltage with the voltage which is higher than the base voltage by the predetermined voltage and with the voltage which is lower than the base voltage by the predetermined voltage; and the external control means for generating the control signal for stopping the operation of the external circuit for a period of time from the timing when the comparison result of the second or third comparing means has been inverted to the timing when the first comparison result is inverted. Thus, the influence by the external noises is suppressed and the correct conversion result can be obtained.

The present invention is not limited to the foregoing embodiment but many modifications and variations are possible within the spirit and scope of the appended claims of the invention.

What is claimed is:

1. An analog/digital converter comprising:
   a switcher to switch an analog voltage as a conversion target and a reference voltage whose polarity is different from that of said analog voltage and to sequentially output them;
   an integrating circuit to continuously integrate said analog voltage and said reference voltage which are outputted from said switcher and to form an integration voltage;
   a first comparator to compare said integration voltage with a base voltage and to output a first comparison result;
   a second comparator to compare said integration voltage with a voltage that is higher than said base voltage by a predetermined voltage and to output a second comparison result;
   a third comparator to compare said integration voltage with a voltage that is lower than said base voltage by a predetermined voltage and to output a third comparison result;
   a counter to count a time which is required from a start of the integration of said reference voltage in said integrating circuit to a timing when said first comparison result is inverted and to output a count result as a digital signal corresponding to said analog voltage;
   a first measuring circuit to measure a difference between the inversion time of said first comparison result and that of said second comparison result;
   a second measuring circuit to measure a difference between the inversion time of said first comparison result and that of said third comparison result; and
   a fourth comparator to compare measurement results of said first and second measuring circuits and to discriminate whether a difference between them lies within a permission value or not.

2. A converter according to claim 1, wherein the analog voltage as a conversion target is outputted from said switcher and integrated by said integrating circuit, the reference voltage is subsequently outputted from the switcher and continuously integrated by the integrating circuits, the integration voltage formed by the integrating circuit is compared with the base voltage by said first comparator, said first comparison result is outputted, the time which is required from the start of the integration of the reference voltage by the integrating circuit to the inversion of the first comparison result is counted by said counter, and the count result is outputted as the digital signal.

3. A converter according to claim 1, wherein the integration voltage is compared with the voltage that is higher than the base voltage by the predetermined voltage by said second comparator, the second comparison result is outputted, the integration voltage is compared with the voltage that is lower than the base voltage by the predetermined voltage by said third comparator, the third comparison result is outputted, the difference between the inversion time of the first comparison result and that of the second comparison result is measured by said first measuring circuit, the difference between the inversion time of the first comparison result and that of the third comparison result is measured by said second measuring circuit, the measurement results of said first and second measuring circuits are compared by the fourth comparator, and whether a difference between them lies within the permission value or not is discriminated.

4. An analog/digital converter comprising:
   a switcher to switch an analog voltage as a conversion target and a reference voltage whose polarity is different from that of said analog voltage and to sequentially to output them;
   an integrating circuit to continuously integrate said analog voltage and said reference voltage which are outputted from said switcher and to form an integration voltage;
   a first comparator to compare said integration voltage with a base voltage and to output a first comparison result;
   a second comparing circuit to compare said integration voltage with a voltage that is higher than said base voltage by a predetermined voltage and to output a second comparison result;
   a third comparator to compare said integration voltage with a voltage that is lower than said base voltage by a predetermined voltage and to output a third comparison result;
   a counter to count a time which is required from a start of the integration of said reference voltage in said integrating circuit to a timing when said first comparison result is inverted and to output a count result as a digital signal corresponding to said analog voltage; and
   an external control circuit to output a control signal for stopping an operation to an external circuit serving as a noise generation source for a period of time from a timing when said second or third comparison result has been inverted to a timing when said first comparison result is inverted.

5. A converter according to claim 4, wherein an analog voltage as a conversion target is outputted from said switcher and integrated by said integrating circuit, the reference voltage is subsequently outputted from the switcher and continuously integrated by the integrating circuit, the integration voltage formed by the integrating circuit is compared with the base voltage by said first comparator, a first comparison result is outputted, the time which is required from the start of the integration of the reference voltage by the integrating circuit to a timing when the first comparison result is inverted is counted by said counter, and a count result is outputted as the digital signal.

6. A converter according to claim 4, wherein the integration voltage is compared with the voltage that is higher than the base voltage by the predetermined voltage by said second comparator, the second comparison result is outputted, the integration voltage is compared with the voltage that is lower than the base voltage by the predetermined voltage by said third comparator, the third comparison result is outputted, the second and third comparison results are supplied to the external control circuit, for a period of time from a timing when the second or third comparison result has been inverted to a timing when the first comparison result is inverted, the control signal to stop the operation of the external circuit serving as a noise generation source is generated.

* * * * *